United States Patent [19]
Zell et al.

[11] Patent Number: 5,392,194
[45] Date of Patent: Feb. 21, 1995

[54] CODING DEVICE FOR ASSEMBLING PLUGABLE ELECTRICAL ASSEMBLIES INTO A MODULE

[75] Inventors: Karl Zell, Niederpoecking; Juergen Seibold, Baierbrunn; Peter Seidel, Groebenzell, all of Germany

[73] Assignee: Siemens Aktiengesellschaft, Munich, Germany

[21] Appl. No.: 78,108

[22] Filed: Jun. 18, 1993

[30] Foreign Application Priority Data

Jun. 29, 1992 [DE] Germany .................. 9208701[U]

[51] Int. Cl.⁶ ............................................. H05K 1/04
[52] U.S. Cl. .................................. 361/785; 220/23.4; 361/802; 439/717
[58] Field of Search ............... 206/503, 508, 509, 511, 206/821; 200/307; 220/23.4, 23.6; 439/53, 292, 374, 377, 378, 717; 361/729, 730, 735, 786, 784, 785, 788, 790, 796, 802, 810, 823

[56] References Cited

U.S. PATENT DOCUMENTS

| | | | |
|---|---|---|---|
| 3,286,070 | 11/1966 | Volker | 200/307 |
| 4,423,465 | 12/1983 | Teng-Ching | 200/307 |
| 4,703,394 | 10/1987 | Petit | 361/413 |
| 5,019,947 | 5/1991 | Pelzl | 361/415 |
| 5,266,912 | 11/1993 | Kledzik | 333/247 |

*Primary Examiner*—Gerald P. Tolin
*Attorney, Agent, or Firm*—Hill, Steadman & Simpson

[57] ABSTRACT

The invention is directed to a coding device for electrical assemblies that can be inserted parallel to one another into a module frame and that are contacted via plug devices attached at the back to a wiring backplane.

A coding flange having three quadratic openings arranged in a right angle pattern is arranged on the wiring backplane between the guard rails, and a corresponding coding housing likewise provided with three quadratic openings arranged in a right angle pattern is arranged on the assembly next to the plug connector. Coding pins can be selectively oriented within the openings by 90° turns, whereby the free ends of said coding pins are fashioned as tongues having a rectangular cross-section, and the area of the cross-section of the tongues corresponds to half the area of the cross-section of the quadratic openings.

14 Claims, 5 Drawing Sheets

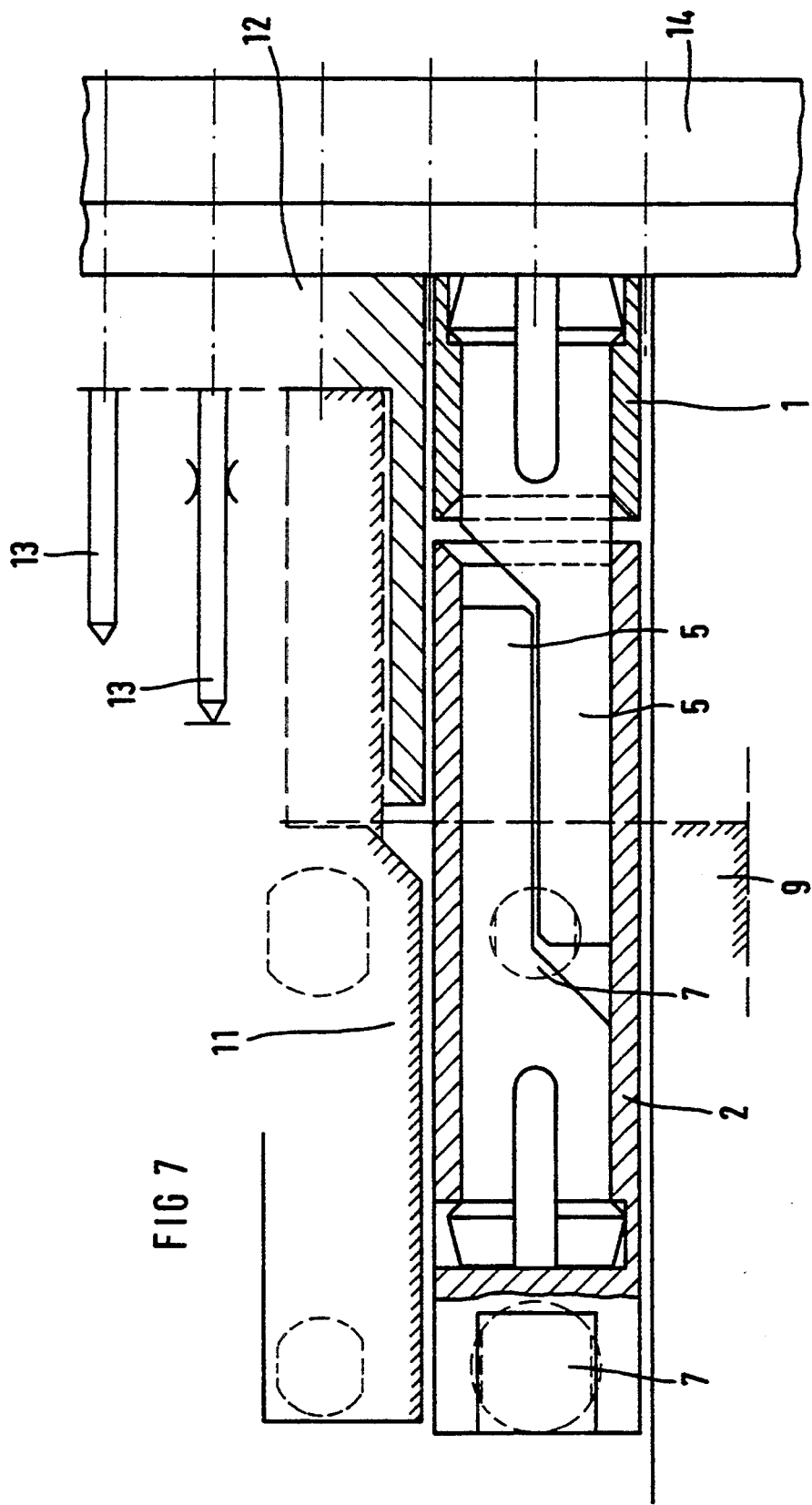

CODING DEVICE FOR ASSEMBLING PLUGABLE ELECTRICAL ASSEMBLIES INTO A MODULE

BACKGROUND OF THE INVENTION

The invention is directed to a coding means for electrical assemblies that are insertable parallel to one another into a module frame and are contacted via plug devices attached at the back to a wiring backplane.

Up to now, codings were attached to the assembly plug or, respectively, integrated into the plug when the division width was not allowed to be exceeded, this having led to contact losses. The possibility of coding on the fastening flanges was also known.

Electrical assemblies should be coded in the module frame, whereby the coding should not lead to an upward transgression of the smallest slot division of 15 mm. Further, the coding should not lead to a modification at frame parts such as guard rails and wiring backplanes, i.e., the frame conditions of the standard IEC48D (Sec) 44 should not be modified.

SUMMARY OF THE INVENTION

This object is achieved for a coding device of the aforementioned species in that a coding flange having three quadratic openings arranged at a right angle relative to one another is arranged on the wiring backplane between the guard rails; in that a corresponding coding housing likewise provided with three quadratic openings arranged at a right angle relative to one another is arranged on the assembly in addition to the plug connector; and in that coding pins can be differently engaged into the openings by 90° turns. The free ends of these coding pins being fashioned as tongues having a rectangular cross-section, whereby the area of the cross-section of the tongues corresponds to half the area of the cross-section of the quadratic openings.

In the coding device of the invention, the space between guard rail and plug connector as well as between the guard rails is utilized in the smallest possible division of 15 mm for the accommodation of a coding. The coding is composed of a coding pin, of a coding housing on the assembly and of a coding flange on the wiring backplane. The prescribed area enables the accommodation of three coding locations into which the coding pin can be differently engaged by 90° turns. In the coding device of the invention, no changes at frame parts such as guard rails and wiring backplanes are necessary.

Further advantages of the present invention are the fact that only one type of coding pin is employed both for the coding housing as well as for the coding flange. Also, the openings in the coding housing are so deep that the coding pins are completely surrounded. Furthermore, the depth of the openings in the coding flange is dimensioned such that the tongues of the coding pins are not surrounded, that is, the tongues protrude outwardly of the coding flange. Also, the coding flange as well as the coding housing are provided with press-in pegs for attachment to said wiring back plane and said electrical assembly respectively.

BRIEF DESCRIPTION OF THE DRAWINGS

FIG. 7 is a partial section through the inserted assembly.

DETAILED DESCRIPTION OF THE PREFERRED EMBODIMENTS

Figure 1:
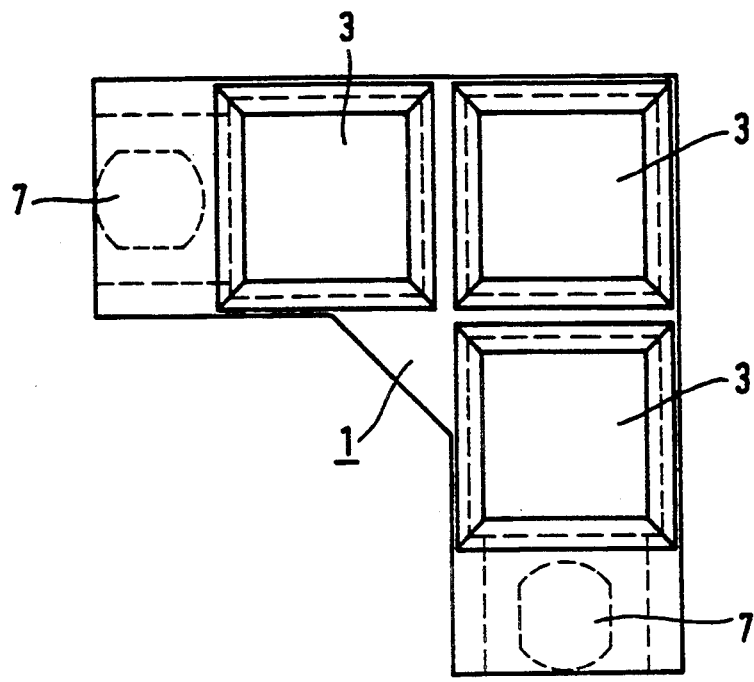
FIG. 1 is a plan view of a coding flange.
Figure 2:
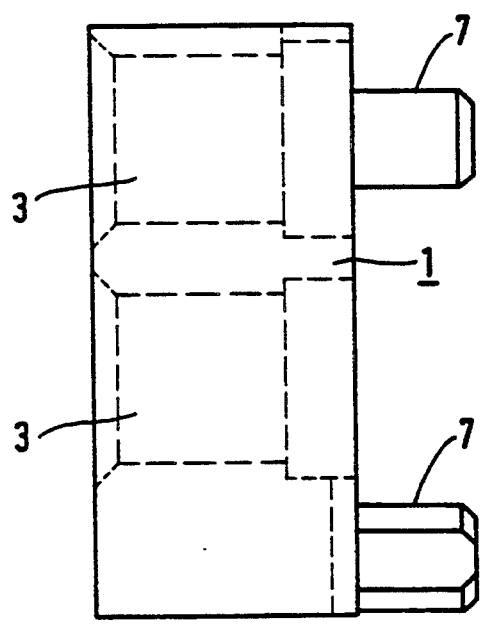
FIG. 2 is a side view of a coding flange.

FIG. 1 and FIG. 2 show the structure of a coding flange 1 for attachment to a wiring backplane. The coding flange 1 is composed of the three openings 3 arranged in a right angle pattern. It may be seen in FIG. 2 that the openings widen in their lower region so that a coding pin 5 can be engaged thereinto, as shall be shown later. Every coding flange 1 is provided with two press-in pegs 7 with which it can be secured to the wiring backplane.

Figure 3:
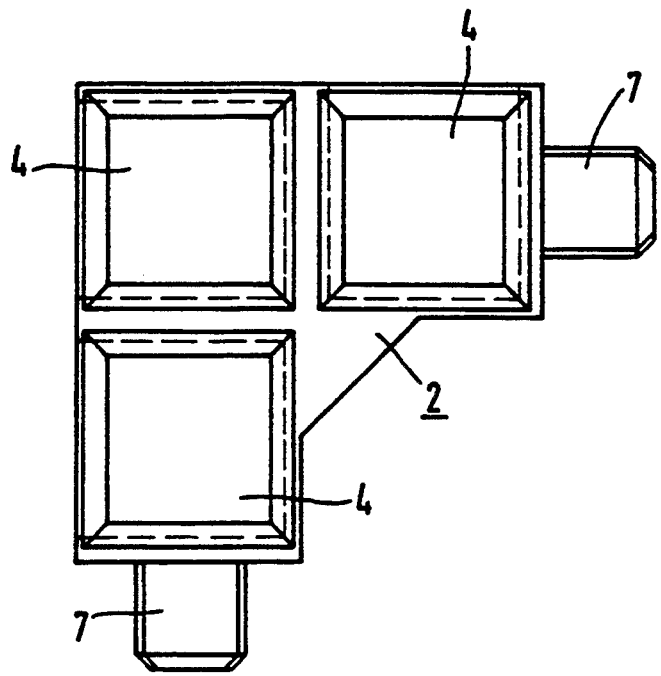
FIG. 3 is a plan view of a coding housing.
Figure 4:
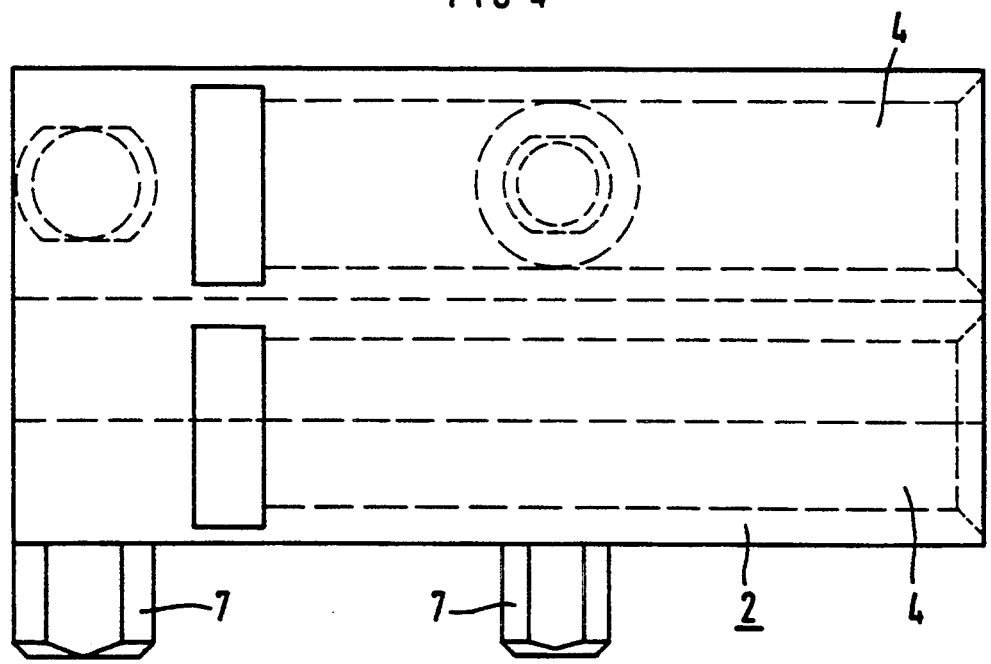
FIG. 4 is a side view of a coding housing.

FIG. 3 and FIG. 4 show a coding housing 2 according to the present invention. This coding housing 2 also comprises essentially three openings 4 arranged in a right angle pattern. Similar to the openings of the coding flange 1, the openings 4 of the coding housing 2 have a quadratic cross-section. Further, the coding housing 2 comprises a plurality of press-in pegs 7 with which it can be secured to the assembly. It may be derived from FIG. 4 that the openings 4 of the coding housing 2 are deeper than the openings 3 of the coding flange. The reason for this shall be set forth later.

Figure 6:
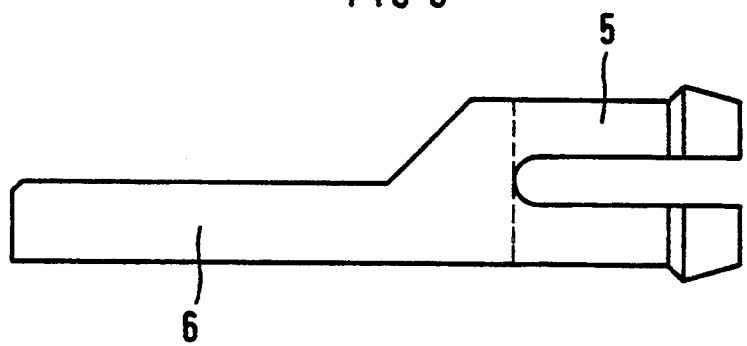
FIG. 6 is a side view of a coding pin.
Figure 5:
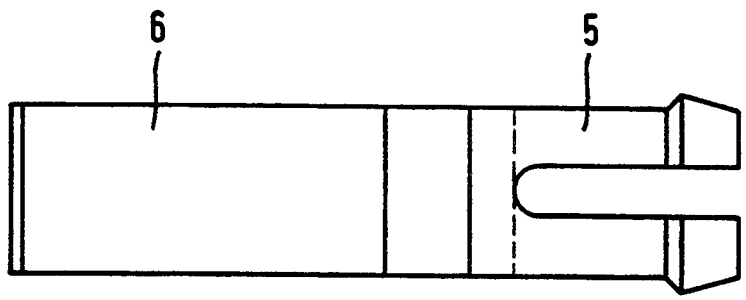
FIG. 5 is a plan view of a coding pin.

FIG. 5 and 6 show the structure of a coding pin. It may be derived from the Figures that the coding pins comprise four resilient catch noses (not referenced in detail here) at their lower end with which they are respectively held in the openings. The front ends of the coding pins 5 are fashioned as tongues 6, whereby the cross-sectional area of the rectangular tongues is half as large as the cross-sectional area of the openings.

FIG. 7 then shows a partial section through an inserted assembly and, thus, through a part of the coding device of the invention at the same time. The coding flange 1 as well as the coding housing 2 may be seen in FIG. 7, whereby the coding flange is secured to the wiring backplane 14, whereas the coding housing 2 is secured to the assembly with the module PC board 9.

The module spring strip 11 of a plug connector is indicated next to the coding housing 2. Further, the centering strip 12 that is slipped onto the contact plates 13 of the wiring backplane 14 is indicated next to the coding device. This Figure is essentially intended to show the engagement of the coding pins 5 into the openings 3 and 4, as well as the inter-engagement of the coding pins 5. This may be clearly seen from the Figure.

The openings 4 of the coding housing 2 are dimensioned such that they completely surround the engaged coding pins 5. That is, the coding pin tongue of the coding housing is recessed inside the opening 4. A protection of the coding pins is thus to be achieved in the manipulation of the assembly. The depth of the openings 3 of the coding flange 1 is dimensioned such at the back wall that the coding pins 5 freely project thereagainst. What this is intended to achieve is that the coding pins 5 can be easily grasped and can be easily interchanged given a recoding or, respectively, an incorrect coding without taking the module frame apart.

The length of the coding pins is dimensioned such that the module spring strip 11 on the module has already immersed into the centering strip 12 when the coding pins 5 strike one another.

Figure 8:
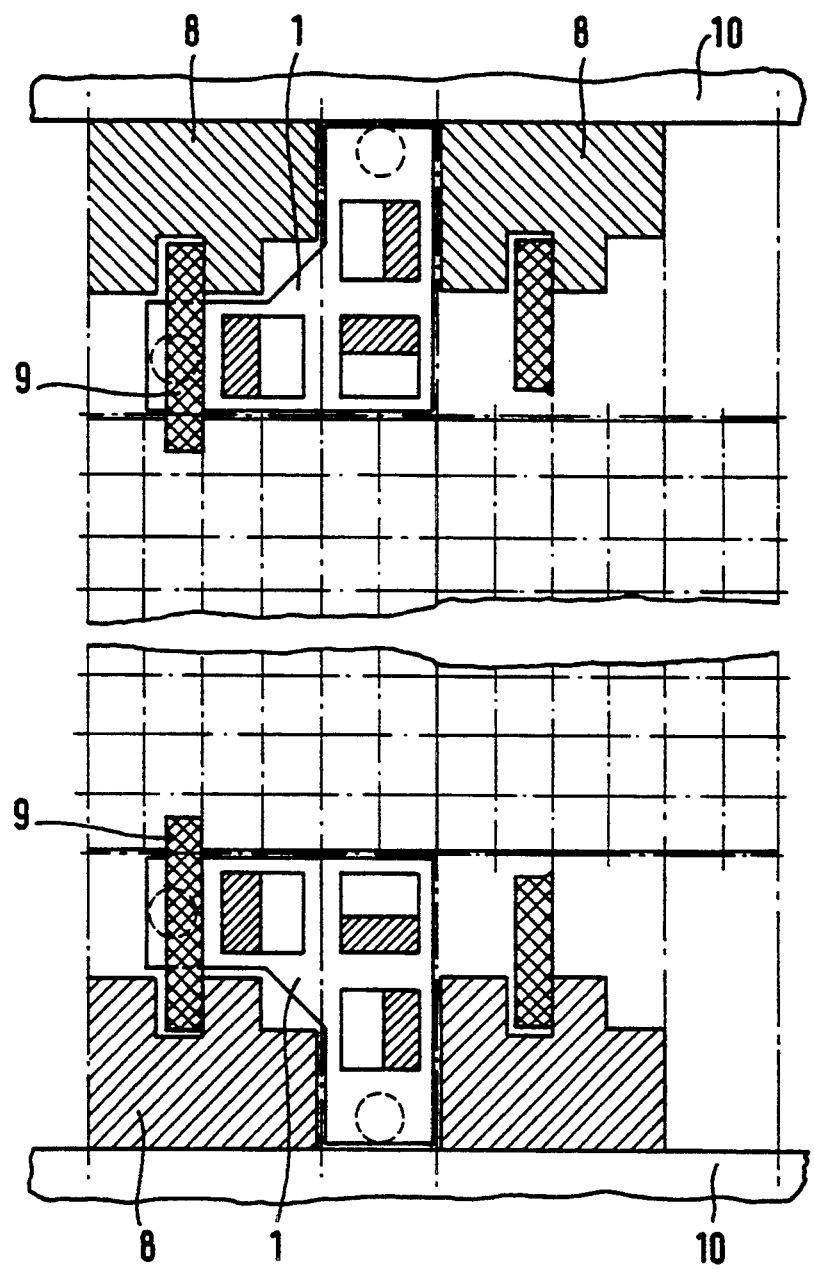
FIG. 8 is a schematic illustration of the coding of a coding device of the present invention.

FIG. 8 schematically shows the coding of a coding device of the present invention. In this Figure, 10 indicates parts of upper and lower module frames to which the guard rails 8 for the module PC boards 9 are secured. The attachment of the coding flange 1 to the wiring back plane also derives from this Figure. As may be easily seen from this Figure, four different insertion possibilities derive for every coding opening by 90° turns of the coding pins. When the same coding is selected both at the top as well as at the bottom, as shown in FIG. 8, 4×4×4=64 different coding possibilities thus derive. When, by contrast, one selects non-identical codings at the top and bottom, then a total of 4096 coding possibilities derive.

Although the present invention has been described with reference to a specific embodiment, those of skill in the art will recognize that changes may be made thereto without departing from the scope and spirit of the invention as set forth in the appended claims.

We claim as our invention:

1. A coding device for electrical assemblies that can be inserted parallel to one another into a module frame and that are contacted to a wiring backplane of the module frame via plug devices attached at a back side of the electrical assemblies, comprising:
    a wiring backplane;
    an electrical assembly having a plug connector for connecting said assembly to the wiring backplane;
    a coding flange having three quadratic first openings arranged in a right angle pattern, the coding flange arranged on the wiring backplane between guard rails;
    a coding housing likewise provided with three quadratic second openings arranged in a right angle pattern and arranged on the assembly next to the plug connector; and
    a plurality of coding pins one of said coding pins located within each of said first and second openings and which can be selectively oriented relative to and within the openings by 90° turns, the free ends of said coding pins being fashioned as tongues having a rectangular cross-section, whereby the area of the cross-section of each tongue is approximately equal to half the area of the cross-section of each quadratic first and second opening.

2. A coding device according to claim 1, wherein said plurality of coding pins are identical for both for the coding housing as well as for the coding flange.

3. A coding device according to claim 1, wherein the second openings in the coding housing are so deep that the coding pins therein are entirely recessed.

4. A coding device according to claim 1, wherein the depth of the first openings in the coding flange is dimensioned such that the tongues of the coding pins located therein are exposed.

5. A coding device according to claim 1, wherein the coding flange as well as the coding housing are provided with press-in pegs attached to said wiring backplane and said electrical assembly respectively.

6. A coding device according to claim 1, wherein at least one of said tongues protrudes outwardly of its respective opening of said coding flange or said coding housing and is connected into a respective corresponding opening in the respective other of said coding flange or coding housing, tightly meshing with a tongue of a coding pin residing therein.

7. A coding device according to claim 1, wherein all of said coding pins in one of said coding flange or said coding housing are recessed and all of said coding pins in the respective other of said coding flange or said coding housing protrude outwardly, and with said coding flange and said coding housing abutted together, said pins which protrude outwardly penetrate into openings of said respective opposite coding flange or coding housing and tightly mesh with said pins which are recessed.

8. A coding device for electrical circuit board assemblies that can be inserted parallel to one another into a module frame and that are contacted to a wiring backplane of the module frame via plug devices attached at a back side of the electrical assemblies, comprising:
    a matching combination of a coding flange and a coding housing;
    the coding flange having first openings arranged in a pattern, the coding flange having first means for connected to a wiring backplane between guard rails;
    the coding housing likewise provided with second openings arranged in an identical pattern and having second means for connecting to an electrical circuit board assembly; and
    a plurality of coding pins one of said coding pins located within each of said first and second openings and which can be selectively oriented within and relative to the first and second openings by 90° turns, the free ends of said coding pins being fashioned as tongues having a select cross-section, whereby the area of the cross-section of each tongue is approximately equal to half the area of the cross-section of each of the openings.

9. A coding device according to claim 8, wherein said plurality of coding pins are identical for the coding housing as well as for the coding flange.

10. A coding device according to claim 8, wherein the openings in the coding housing are so deep that the coding pins therein are entirely recessed.

11. A coding device according to claim 8, wherein the depth of the openings in the coding flange is dimensioned such that the tongues of the coding pins are exposed.

12. A coding device according to claim 8, wherein the first and second means for connecting each comprise pressing pegs.

13. A coding device according to claim 8, wherein at least one of said tongues protrudes outwardly of its respective opening of said coding flange or said coding housing and is connected into a respective corresponding opening in the respective other of said coding flange or coding housing, tightly meshing with a tongue of a coding pin residing therein.

14. A coding device according to claim 8, wherein all of said coding pins in one of said coding flange or said coding housing are recessed and all of said coding pins in the respective other of said coding flange or said coding housing protrude outwardly, and with said coding flange and said coding housing abutted together, said pins which protrude outwardly penetrate into openings of said respective opposite coding flange or coding housing and tightly mesh with said pins which are recessed.

* * * * *